US008108991B2

(12) United States Patent  (10) Patent No.: US 8,108,991 B2
Saito  (45) Date of Patent: Feb. 7, 2012

(54) METHOD AND DEVICE FOR CONNECTING A WIRING BOARD

(75) Inventor: Masao Saito, Tokyo (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 12/734,285

(22) PCT Filed: Sep. 4, 2008

(86) PCT No.: PCT/JP2008/065944
§ 371 (c)(1),
(2), (4) Date: May 25, 2010

(87) PCT Pub. No.: WO2009/054191
PCT Pub. Date: Apr. 30, 2009

(65) Prior Publication Data
US 2010/0251541 A1 Oct. 7, 2010

(30) Foreign Application Priority Data
Oct. 23, 2007 (JP) ................................. 2007-275184

(51) Int. Cl.
H05K 3/36 (2006.01)
(52) U.S. Cl. ................................ 29/830; 29/832; 29/840
(58) Field of Classification Search .................... 29/825, 29/830, 832, 840, 876
See application file for complete search history.

(56) References Cited

U.S. PATENT DOCUMENTS

| 5,518,964 A * | 5/1996 | DiStefano et al. | 438/113 |
| 5,798,286 A * | 8/1998 | Faraci et al. | 438/113 |
| 6,147,400 A * | 11/2000 | Faraci et al. | 257/723 |
| 6,475,877 B1 * | 11/2002 | Saia et al. | 438/460 |

FOREIGN PATENT DOCUMENTS

WO WO 2006/126586 A1 11/2006
WO WO 2007/097223 A1 8/2007

* cited by examiner

Primary Examiner — Carl Arbes
(74) Attorney, Agent, or Firm — Manabu Kanesaka (57) ABSTRACT

Connection with an ACF is realized relative to a wiring board having an electronic component mounted on the rear surface thereof with high connection reliability and uniform thermal compression bonding. A thermal compression bonding head 12 is used to apply pressure to flexible printed circuit boards 4 and 5 relative to a motherboard substrate 1 having an electronic component 6 mounted thereon and heat an anisotropic conductive film, thereby connecting the motherboard substrate 1 with the ACF to the flexible printed circuit boards 4 and 5 that are connecting members. At this time, in a state in which a receiving plate 13 made of an elastic material, such as silicone rubber, and provided at a mounting position of the electronic component 6 of the motherboard substrate 1 with a concave portion 13a corresponding in shape to the electronic component 6 supports thereon the rear surface of the motherboard substrate 1, the thermal compression bonding is performed.

10 Claims, 6 Drawing Sheets

FIG. 6

METHOD AND DEVICE FOR CONNECTING A WIRING BOARD

RELATED APPLICATIONS

The present application is National Phase of International Application No. PCT/JP2008/065944 filed Sep. 4, 2008 and claims priority from, Japanese Application No. 2007-275184 filed Oct. 23, 2007, the disclosure of which is hereby incorporated by reference herein in its entirety.

BACKGROUND OF THE INVENTION

1. Field of the Invention

The present invention relates to a wiring board receiving plate used in connecting a wiring board or electronic component to a different wiring board having an electronic component mounted thereon and further to a connection device and method of a wiring board using the receiving plate.

2. Description of the Prior Art

In mounting a semiconductor device on a wiring board, for example, the flip-chip mounting method for mounting it on the wiring board in a so-called face-down state has been proposed and, for electrical connection between electrodes and for physical fixation of the semiconductor device, an anisotropic conductive film (ACF) has been used. The anisotropic conductive film has conducting particles dispersed in a binder resin serving as an adhesive agent, is sandwiched between an electrode on the wiring board and an opposite electrode of the semiconductor device and is heated and pressed to crush the conducting particles between the electrodes, thereby attaining the electrical connection between the electrodes. Since the conducting particles at portions provided with no electrode are maintained in a state of being dispersed in the binder resin and kept in an electrically insulated state, the electrical continuity is attained only at portions provided with the electrodes.

A method for mounting a semiconductor device using the anisotropic conductive film comprises disposing the semiconductor on a wiring board having the anisotropic conductive film attached thereto, using a thermal compression bonding head to press the semiconductor device while heating the anisotropic conductive film, thereby crushing the conducting particles between the electrodes and hardening the anisotropic conductive film to thereby subject the semiconductor device to thermal compression bonding. In the thermal compression bonding, as disclosed in Patent Document 1 as JP 10-256311 A, chip parts different in height are mounted in a lump through heating and pressure application in the presence of a buffer layer.

In recent years, the mounting method using the anisotropic film has been applied not only to mounting of electronic component, but also to connection of a flexible printed circuit (FPC) board to a motherboard substrate. In connecting a flexible printed circuit board drawn out of a liquid crystal display (LCD) panel or CMOS IC to a motherboard substrate of a mobile phone, for example, connection by soldering or a connector has mainly been used heretofore. However, in association with equipment lightweight, thin and small in size, connection by the anisotropic conductive film tends to be increasing. The connection by the anisotropic conductive film has various merits of realizing a small size and narrow pitch with ease, enabling cost reduction, enabling elimination of disconnection by impact and enabling use of a lead-free structure, for example.

On the other hand, adoption of the connection by the anisotropic conductive film has a demerit of requiring the rear surface of pressure bonded portions to be flattened. In the connection by the anisotropic conductive film, uniform pressure has to be applied to terminals and, in the case of connecting a flexible printed circuit board to a motherboard substrate, for example, no electrical component can be mounted in the vicinity of the rear surface of the connection portion of the motherboard substrate. This is because, when performing the thermal compression bonding, with the portion having mounted the electronic component supported on the rear surface side of the motherboard substrate, there is a possibility of entailing problems of applying uneven pressure, exerting an excessive load on the mounted electronic component and consequently damaging the electronic component.

In this case, mounting of the electronic component on the motherboard substrate is subjected to restraints including a requirement that the component be disposed in consideration of the connection by the anisotropic conductive film and, therefore, a problem of lowering the component-mounting area ratio is imposed.

In order to eliminate the above problems, the side of the receiving plate of the motherboard substrate has to be somewhat devised, and the invention described in Patent Document 2 as JP 2001-15908 A is one of the inventions having such a new twist. In Patent Document 2, disclosed is a method for mounting a circuit board comprising disposing on a substrate-retaining member a circuit board having a circuit component mounted on the rear surface thereof and mounting a signal input/output member on the front surface of the circuit board by thermal compression bonding that is performed while retaining the circuit board on an outer peripheral region of the circuit board and a region of the circuit component corresponding to the outer peripheral region.

In addition, it is also proposed that a component is mounted on the motherboard substrate having an electronic component mounted on the rear surface thereof by heating and pressure application in the presence of a buffer layer, similarly to the invention described in Patent Document 1. In Patent Document 3 as JP 11-354588 A, for example, disclosed is a method for bonding an electronic component provided with a bump for supporting pressure loads in a bonding process dispersed on a substrate supporting body that directly supports the lower surface of a substrate and on an elastic body that elastically supports an electronic component which has already been mounted on a surface opposed to the surface onto which the electronic component provided with the bump is bonded.

In the supporting structure of the invention described in Patent Document 2, however, since only the surroundings of the wiring board and mounting component are supported, it is difficult to stably support the wiring board and problems of flexing the wiring board at the time of thermal compression bonding, damaging the wiring board and applying uneven pressure to the wiring board to induce bad connection will remain. In addition, an increase in number of electronic components to be mounted on the wiring board makes the structure of the substrate-retaining member complicated and necessitates great equipment investment. These are also problematic.

What is conceivable to eliminate these problems is to use a buffer layer (elastic body) as described in Patent Document 3, for example, to support the component-mounting surface of the wiring board. Though this is somewhat expected to exhibit effectiveness to some extent, since the substrate-supporting body that supports the outer peripheral portion can only supports the lower surface of the substrate, it is difficult to realize a stable support state similarly to the invention described in Patent Document 2. In addition, since only the electronic component that has already been mounted is supported on the elastic body at the position on which pressure loads are actually exerted, excessive load is added consequently to the already-mounted electronic component. Particularly, when the difference in mounting height of the electronic components to be mounted is large, it is difficult to uniformly applying pressure even in the presence of the elastic body and to completely eliminate damages of the already-mounted electronic components.

The present invention has been proposed in view of the conventional state of affairs and the object thereof is to provide a wiring board receiving plate capable of realizing uniform thermal compression bonding relative to even a wiring board having an electronic component mounted on the rear surface thereof, eliminating bad connection in the substrate connection and preventing the already-mounted electronic component from being damaged and to further provide a connection device and method for connection of the wiring board. In addition, the further object of the present invention is to provide a wiring substrate receiving plate capable of allowing a circuit designer to freely select component arrangement and enhancing the component-mounting density and to provide a connection device and connection method for the wiring board.

SUMMARY OF THE INVENTION

To achieve the above objects, the wiring board receiving panel of the present invention is used in connecting a connecting member to a first wiring board having an electronic component mounted thereon through thermal compression bonding, made of an elastic material and provided at a mounting position of the electronic component of the first wiring board with a concave portion corresponding in shape to the electronic component.

Similarly, the device for connection of a wiring board according to the present invention comprises a bottom plate for supporting thereon a first wiring board having an electronic component mounted thereon; a thermal compression bonding head disposed on the wiring board via an adhesive agent for applying pressure to a connecting member and heating the adhesive agent to subject the connecting member to thermal compression bonding; and a receiving plate for supporting on the bottom plate a mounting surface of the electronic component of the first wiring board; wherein the receiving plate is made of an elastic material and provided at a mounting position of the electronic component of the first wiring board with an concave portion corresponding in shape to the electronic component.

In addition, the method for connection of a wiring board according to the present invention comprises supporting a lower surface of a first wiring board having an electronic component mounted thereon on a receiving plate made of an elastic material and provided at a mounting position of the electronic component of the first wiring board with a concave portion corresponding in shape to the electronic component; and using a thermal compression bonding head to apply pressure to a connecting member and heat an adhesive agent, thereby subjecting the connecting member to thermal compression bonding relative to the first wiring board.

In the present invention, the receiving panel made of the elastic material is used to thereby support the mounting surface of the electronic component of the first wiring board thereon. Herein, since the receiving plate made of the elastic material is provided therein with the concave portion corresponding in position to the electronic component mounted on the first wiring board, the electronic component is housed in the concave portion and, even at the position at which pressure load is actually exerted, the region of the first wiring board having no electronic component mounted thereon is also supported on the receiving panel to materialize the stable support state and realize uniform thermal compression bonding. In addition, even when the difference in mounting height of the electronic components mounted on the rear surface of the first wiring board is large, for example, the electronic components are also supported under appropriate pressure owing to the elastic displacement of the receiving panel at the time of the thermal compression bonding without applying excessive pressure to the electronic components to further stabilize the support state at the time of the thermal compression bonding.

According to the present invention, it is possible to subject the connecting member (wiring board or electronic component, for example) to uniform thermal conductive bonding relative to the first wiring board having the electronic component mounted on the rear surface thereof and to realize the highly reliable connection state without incurring bad connection. In addition, there is no possibility of disadvantages of damaging the mounted electronic component being induced when performing the thermal conductive bonding.

Furthermore, according to the present invention, mounting of the electronic component on the rear surface of the motherboard substrate is not subjected to restraints and, for example, a circuit designer can freely select component arrangement. As a result, the component mounting density can be, enhanced to enable the wiring board to be small in size, lightweight and thin.

DETAILED DESCRIPTION OF THE INVENTION

An embodiment of a wiring board receiving plate and a device and method for connection of a wiring board according to the present invention will be described hereinafter in detail with reference to the drawings. Incidentally, though a case where a second wiring board is connected as a connecting member to a motherboard substrate that is a first wiring board is described below as an example, it is similarly applicable also to a case where an electronic component as a connecting member is mounted on the motherboard substrate that is the first wiring board substrate.

Figure 1:
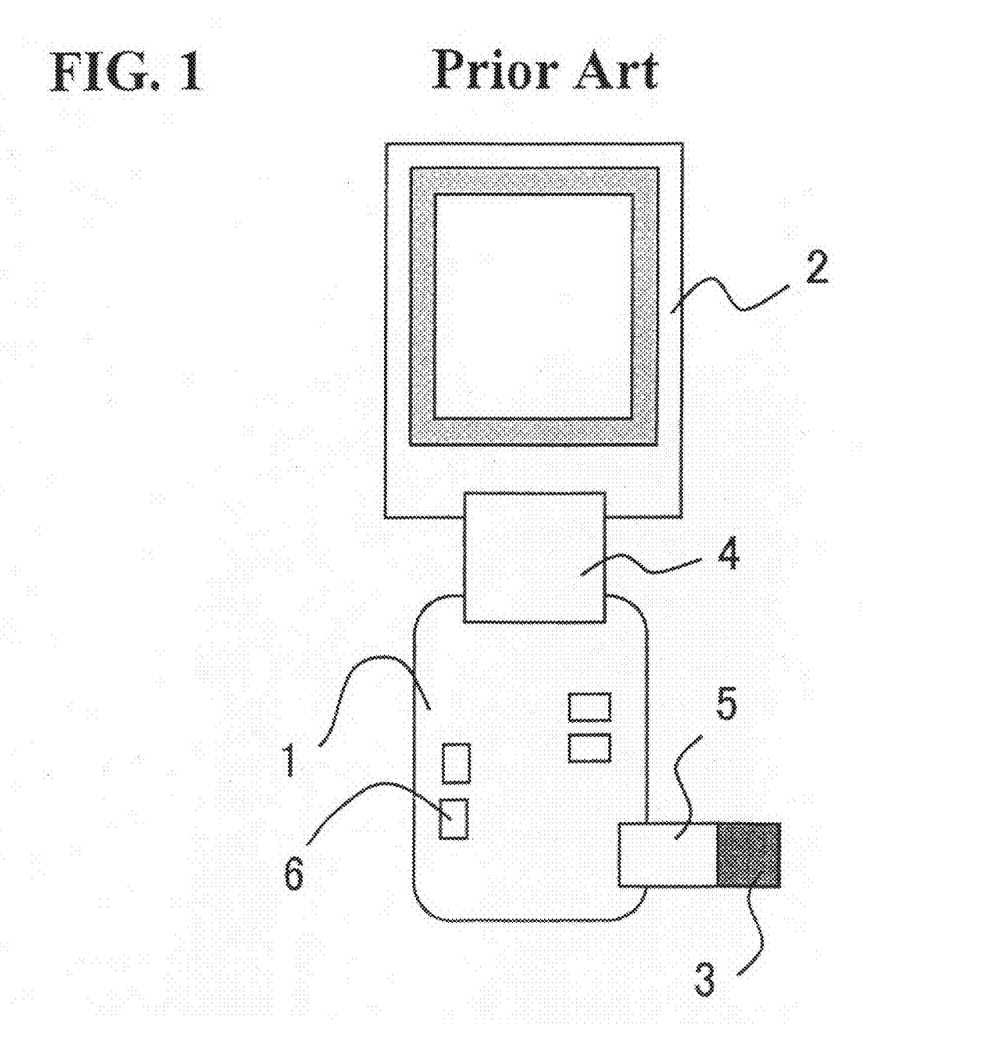
FIG. 1 is a schematic plan view showing an example of connection of a second wiring board to a motherboard substrate.

First, an example of the configuration of a wiring board to be connected using a connection device and a connection method according to the present invention will be described. In FIG. 1, a liquid crystal display panel 2 and a CMOS IC 3 are electrically connected to a motherboard substrate (corresponding to a first wiring board) 1 via flexible printed circuit boards 4 and 5, respectively. Here, the flexible printed circuit boards 4 and 5 correspond to second wiring boards and are electrically and physically connected and fixed by thermal compression bonding to the motherboard substrate 1 via anisotropic conductive films.

Figure 2A:
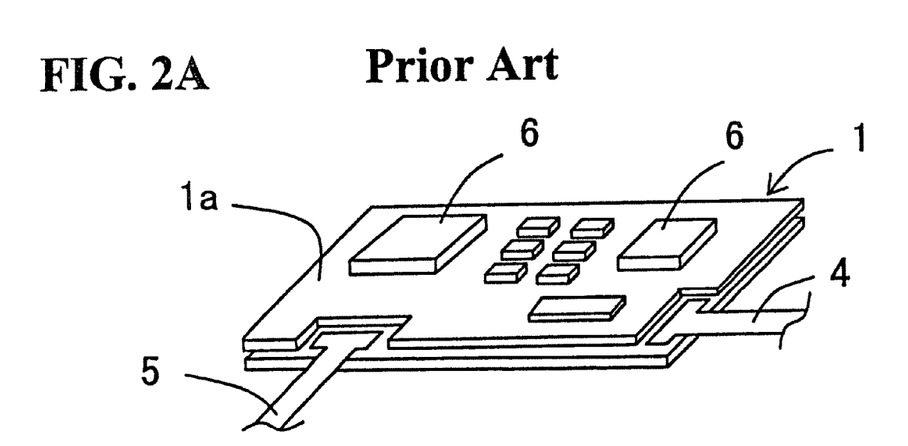
FIG. 2A is a schematic perspective view of the front surface of the motherboard substrate and FIG. 2B is a schematic perspective view of the rear surface of the motherboard substrate.
Figure 2B:
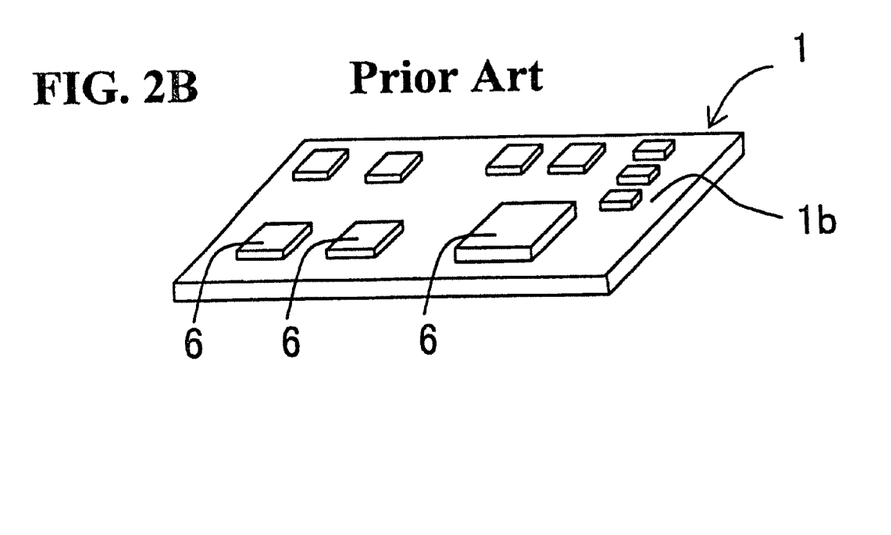

Various kinds of electronic components 6 are mounted on the motherboard substrate 1, specifically, not only on the front surface (surface to which the flexible printed circuit boards 4 and 5 are connected) 1a of the motherboard substrate 1 as shown in FIG. 2A, but also on the opposite surface (rear surface 1b) as shown in FIG. 2B.

Figure 3:
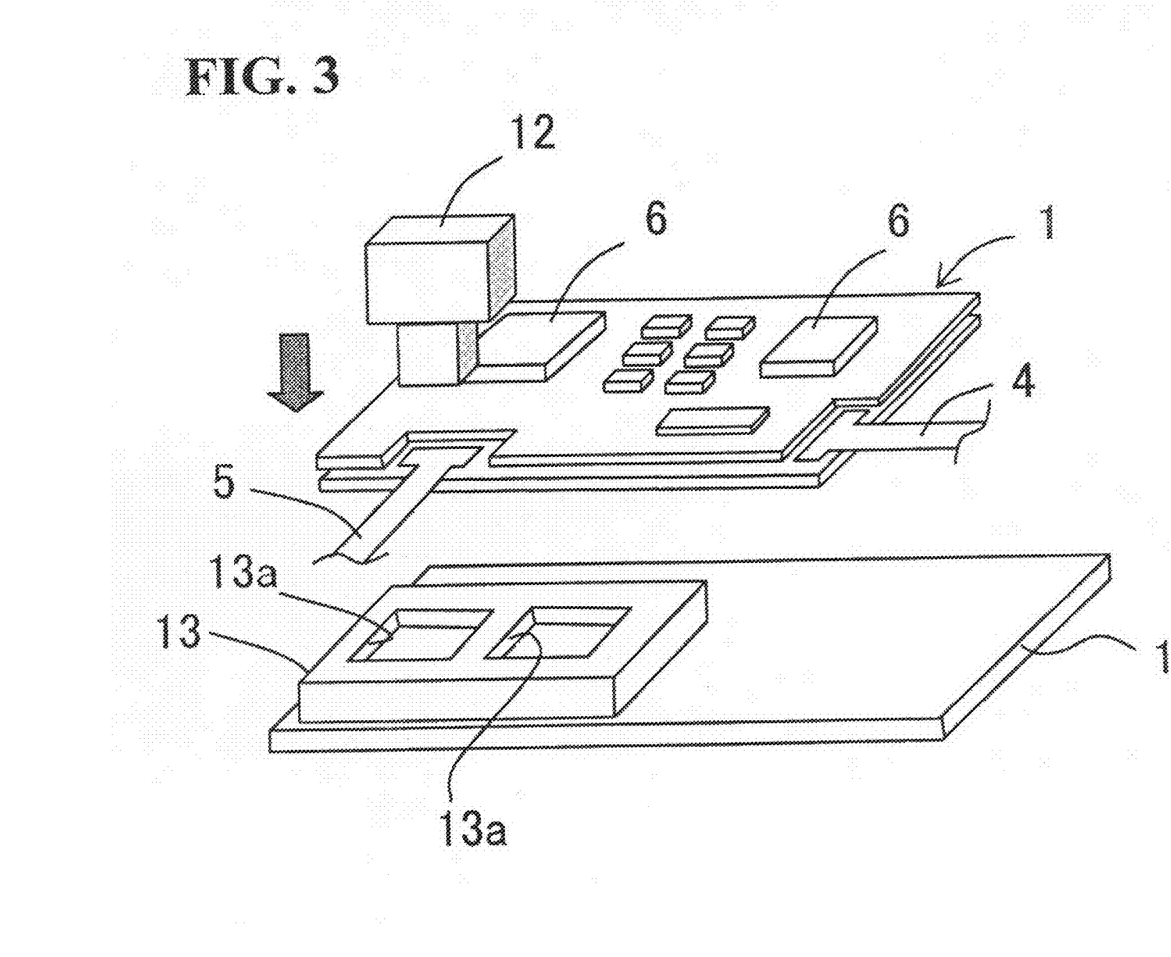
FIG. 3 is a schematic perspective view showing an example of a connection device used in connecting a flexible printed circuit board to the motherboard substrate with an ACF according to Embodiment 1.

When connecting the flexible printed circuit boards 4 and 5 to the motherboard substrate 1, as shown in FIG. 3, a connection device equipped with a bottom plate 11 and a thermal compression bonding head 12 is used to perform thermal compression bonding in the presence of anisotropic conductive films (not shown) that are adhesive agents, thereby connecting the boards to the substrate.

The anisotropic conductive film is a film having conducting particles dispersed in a binder resin serving as an adhesive agent and functions to electrically and mechanically connect the flexible printed circuit boards 4 and 5 to the motherboard substrate 1. To be specific, a terminal pattern formed on the motherboard substrate 1 and terminal patterns formed on the flexible printed circuit boards 4 and 5 are pressed and heated at facing portions thereof to crush the conducting particles, thereby attaining electrical continuity between a wiring pattern on the motherboard substrate 1 and wiring patterns on the flexible printed circuit boards 4 and 5. The binder resin serving as the adhesive agent starts hardening when it is heated to a hardening start temperature or more, for example, to mechanically fix the flexible printed circuit boards 4 and 5 to the motherboard substrate 1.

Here, in the connection device, the bottom plate 11 and thermal compression bonding head 12 are generally made of a hard material, such as metal, ceramic, etc. Why the hard material is thus used for the bottom plate 11 and thermal compression bonding head 12 is for applying necessary and sufficient pressure for a short period of time. When the electronic component 6 has been mounted on the rear surface of the motherboard substrate 1, however, use the bottom plate 11 and thermal compression bonding head 12 made of the hard material makes stable application of prescribed pressure to connection sections difficult and entails a problem of failure to obtain necessary connection. In addition, impact of the thermal compression bonding head 12 exerted onto the electronic component 6 may possibly induce disadvantages of damaging the electronic component 6 per se and breaking the connection between the electronic component 6 and the motherboard substrate 1.

In the present embodiment 1 and 2, therefore, a receiving plate 13 made of an elastic material is placed on the bottom plate 11 to support the rear surface side of the motherboard substrate 1 on the receiving plate 13. The receiving plate 13 will be described hereinafter in detail.

The receiving plate 13 is formed of the elastic material and configured so as to stably support the rear surface side of the motherboard substrate 1. Though an optional material can be selected as the elastic material, silicone rubber is advantageously used because it is excellent in heat resistance and oil resistance. Though the rubber hardness degrees of the elastic material forming the receiving plate 13 are optional, elastomer having the rubber hardness degrees of 40 or more and 90 or less prescribed by the Japanese Industrial Standards (JIS S 6050) is preferably used.

The receiving plate 13 is provided therein with a concave portion 13a formed by sculpture, for example, at a position corresponding to a mounting position of the electronic component 6 on the rear surface of the motherboard substrate 1. The concave portion 13a is adapted to prevent the electronic component 6 from hitting the receiving plate 13 and has a size slightly larger than that of the electronic component 6. Therefore, when the motherboard substrate 1 has been placed on the receiving plate 13, the electronic component 6 on the rear surface of the motherboard substrate 1 is housed in the concave portion 13a to allow an upper surface 13b of the receiving plate 13 to abut on the flat surface of the motherboard substrate 1 at the outer periphery of the motherboard substrate and also at a position thereof onto which pressure load is actually exerted.

Figure 4:
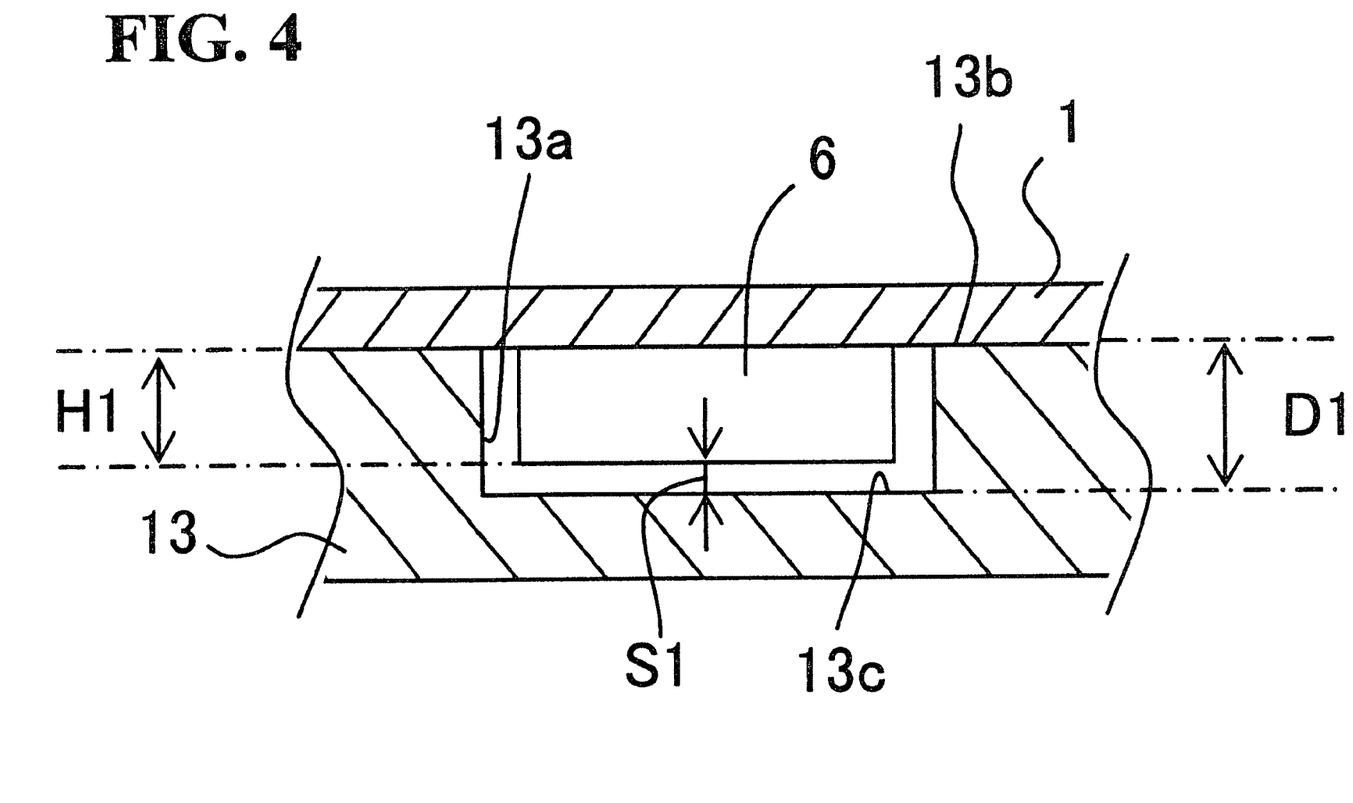
FIG. 4 is a schematic view showing an example of relationship between the height of an electronic component mounted on the rear surface of the motherboard substrate and the depth of a concave portion formed in a receiving plate according to Embodiment 1.

It is preferred that the depth of the concave portion 13a of the receiving plate 13 is appropriately set. As shown in FIG. 4, for example, when a depth D1 of the concave portion 13a is larger than a mounting height H1 of the electronic component 6 mounted on the motherboard substrate 1, a space is formed between the top of the electronic component 6 and a bottom surface 13c of the concave portion 13a. The depth D1 of the concave portion 13a is preferably designed depending on the mounting height H1 so that a dimension S1 of the space may become 1 mm or less. As a result, the receiving plate 13 made of the elastic material is elastically displaced at the time of thermal compression bonding to allow the upper surface 13b of the receiving plate 13 to abut on the top of the flat surface of the motherboard substrate 1 and bring the bottom surface 13c of the concave portion 13a into contact with the top of the electronic component 6 by means of pressure application, thereby realizing an extremely stable support state. In addition, the bottom surface 13a applies appropriate pressure to the electronic component 6 and, therefore, there is no case where excessive pressure or impact is applied or exerted onto the electronic component.

Figure 5:
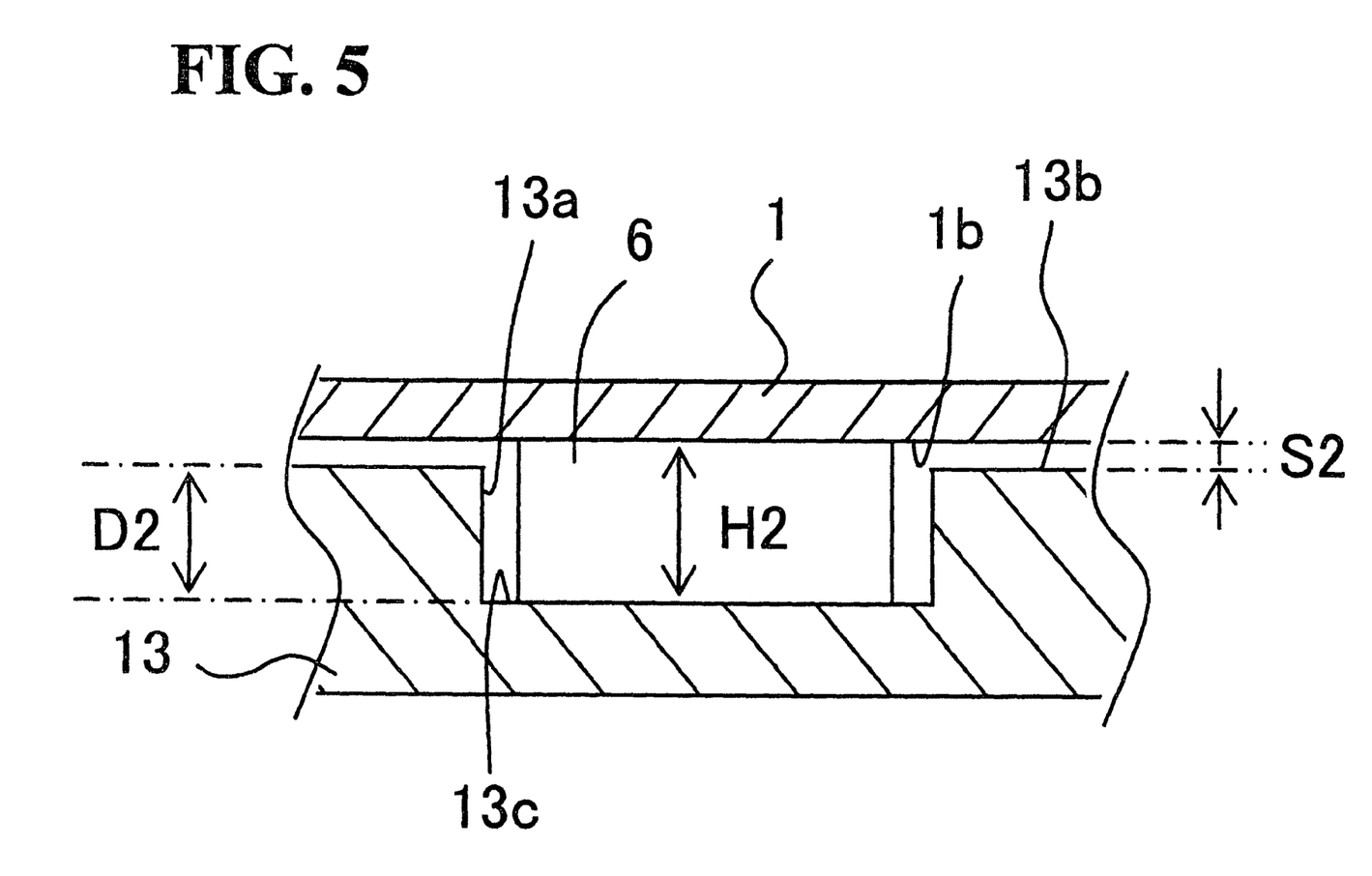
FIG. 5 is a schematic view showing another example of relationship between the height of the electronic component mounted on the rear surface of the motherboard substrate and the depth of the concave portion formed in the receiving plate according to Embodiment 2.

Otherwise, as shown in FIG. 5 as Embodiment 2, it is also possible to make a mounting height H2 of the electronic component 6 mounted on the motherboard substrate larger than a depth D2 of the concave portion 13a. In this case, the state before the thermal compression bonding is a state in which the bottom surface 13c of the concave portion 13a abuts on the electronic component 6, whereas the upper surface 13b of the receiving plate 13 does not abut on the rear surface of the motherboard substrate 1. At the time of the thermal compression bonding, however, the upper surface 13b of the receiving plate abuts on the rear surface of the motherboard substrate 1 owing to the elastic displacement of the receiving plate 13, thereby realizing a stable support state. In this case, preferably, the depth D1 of the concave portion 13a is designed depending on the mounting height H1 so that a dimension S2 of a space between the upper surface 13b of the receiving panel 13 and the rear surface of the motherboard substrate 1 may become 1 mm or less.

Incidentally, in the case where plural electronic components 6 are mounted on the rear surface of the motherboard substrate 1, plural concave portions 13a corresponding to the plural electronic components 6 are formed in the receiving plate 13. Preferably, in this case, the depths of the concave portions 13a are set individually depending on the mounting heights of the corresponding electronic components 6. As a result, even when the difference in mounting height among the electronic components is large, each of the electronic components is supported under appropriate pressure owing to the elastic displacement of the receiving plate without exerting any excessive pressure onto an electronic component having a large mounting height, for example. When the difference in mounting heights among the electronic components 6 is small, the depths of all the concave portions 13a may be set without exception.

The size of the receiving plate 13 is preferably the same as that of the motherboard substrate 1 to make it possible to support the motherboard substrate 1 thereon. However, this is not limitative. For example, the receiving plate 13 may have a size at least corresponding to a region to be subjected to thermal compression bonding. In this case, since the receiving plate 13 abuts locally on the motherboard substrate 1, the size thereof minimum to enable the motherboard substrate to be stably supported is preferably secured.

In order to perform the connection (thermal compression bonding) between the motherboard substrate 1 and the flexible printed circuit boards 4 and 5 using the receiving plate 13 and connection device having the aforementioned configurations, first the receiving plate 13 made of the elastic material and provided with the concave portion 13a is placed on the bottom plate 11. The motherboard substrate 1 that is the first wiring board is further placed on the receiving plate 13. At this time, the electronic component 6 mounted on the rear surface of the motherboard substrate 1 is aligned in position with the concave portion 13a of the receiving plate 13 so that the electronic component 6 may be housed in the concave portion 13a.

Subsequently, the anisotropic conductive films are placed on the connection portions of the motherboard substrate 1, and the flexible printed circuit boards 4 and 5 to be connected are overlapped with the films. In this state, the connection portions of flexible printed circuit boards 4 and 5 are pressed under prescribed pressure with the thermal compression bonding head 12 and, at the same time, the anisotropic conductive films are heated with the heater built in the thermal conductive bonding head 12. As a result, the conducting particles contained in the anisotropic conductive films are crushed to attain electrical continuity between the motherboard substrate 1 and the flexible printed circuit boards 4 and 5 and, upon completion of hardening of the binder resin, attain mechanical bonding therebetween.

By adopting the connection device and method using the receiving plate 13, the connection portions are uniformly pressed and heated to enable thermal compression bonding, thereby enabling a highly reliable connection state to be realized without incurring bad connection. In addition, there is no case where the electronic components 6 mounted on the motherboard substrate are broken or damaged in performing the thermal compression bonding. Therefore, mounting of the electronic components 6 on the rear surface of the motherboard substrate 1 is not subjected to restraints and, for example, a circuit designer can freely select component arrangement. As a result, the component mounting density can be enhanced to enable the wiring board to be small in size, lightweight and thin.

While the embodiments of the present invention have been described above, it goes without saying that the present invention is not limited to these embodiments and can be modified in a range not departing from the gist of the present invention.

Figure 6:
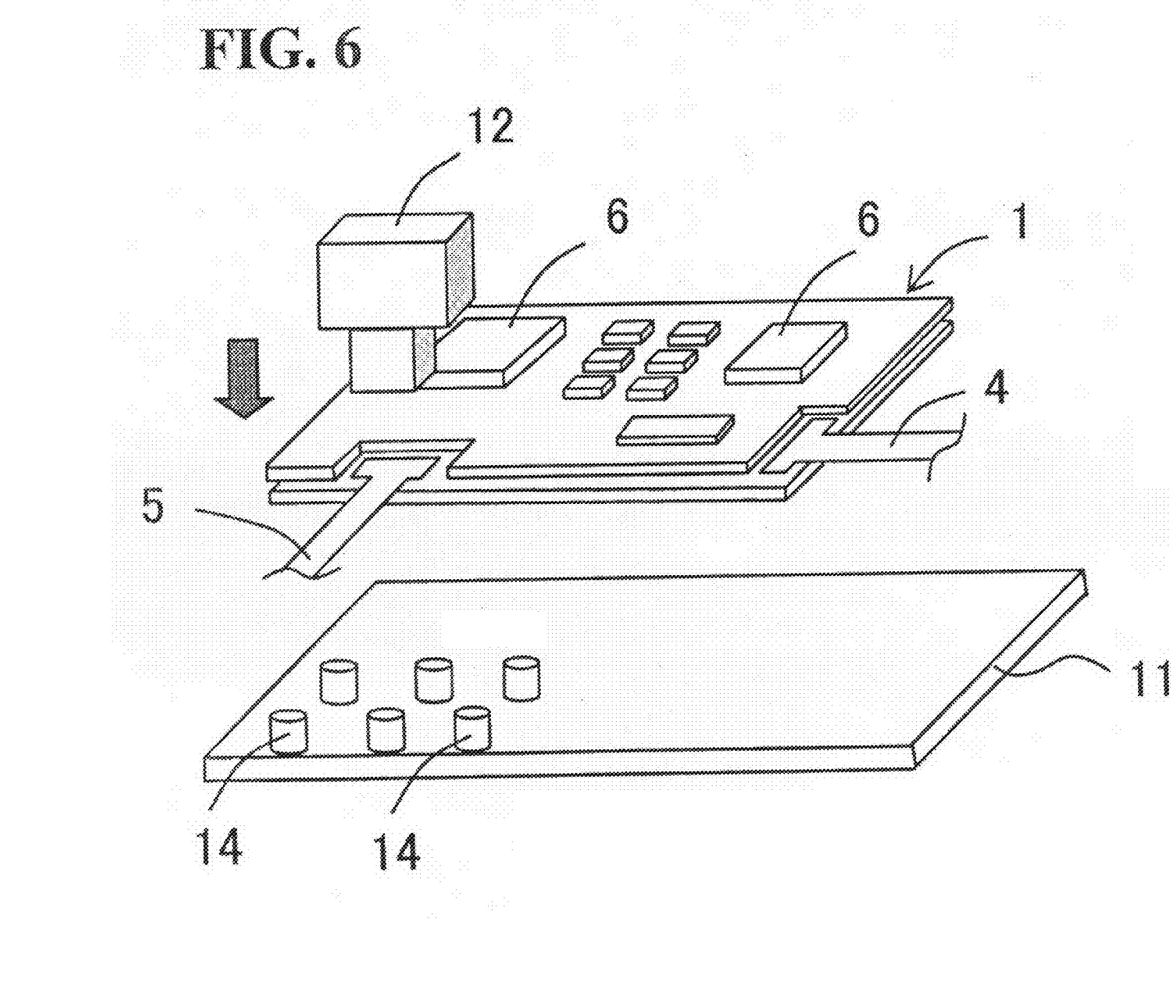
FIG. 6 is a schematic perspective view showing another example of the receiving plate according to Embodiment 3.

While the receiving plate 13 in the above embodiments is subjected to spot facing (sculpture) to form the concave portion 13a, plural projections (pillars) 14 made of an elastic material are formed on the bottom plate 11 as shown in FIG. 6 as Embodiment 3 to utilize these projections 14 as the receiving plate. In this case, regions between adjacent projections 14 function as the concave portions, and the electronic components 6 mounted on the rear surface of the motherboard substrate 1 are housed therein.

Furthermore, in the case where the projections 14 constitute the receiving plate, an elastic plate made of an elastic material is laid on the bottom plate and the projections 14 may be formed thereon. In this case, by designing the height of the projections 14 to be the same as the depth of the concave portions 13a, the same appropriate support state as the case of forming the concave portions 13a can be obtained to realize an extremely stable support state.

EXAMPLES

Next, concrete examples of the present invention will be described based on the experimental results.

Example 1

A printed-wiring board (corresponding to the first wiring board) formed with electrode terminals having a pitch of 200 µm, in which L/S=100 µm/100 µm, and a flexible printed circuit board (corresponding to the second wiring board) were prepared and connected to each other with an ACF using a receiving plate made of silicon rubber (silicone rubber). Incidentally, concave portions corresponding in number to electronic components mounted on the printed-wiring board were formed in the receiving plate made of the silicon rubber. The rubber hardness degree of the receiving plate made of the silicon rubber was 40. In addition, as the anisotropic conductive film, that produced by Sony Chemical & Information Device Corporation and sold under the trade name of CP5842KS was used. As the thermal compression bonding head, a heater built-in head was used to perform heating and pressure application.

Example 2

A printed-wiring board and a flexible printed circuit board were connected to each other with an ACF in the same manner as in Example 1, except that the rubber hardness degree of the receiving plate made of silicon rubber was set to be 90.

Example 3

A printed-wiring board and a flexible printed circuit board were connected to each other with an ACF in the same manner as in Example 1, except that the rubber hardness degree of the receiving plate made of silicon rubber was set to be 20.

Comparative Example 1

A printed-wiring board and a flexible printed circuit board were connected to each other with an ACF in the same manner as in Example 1, except that a receiving plate made of ceramic was used.

Comparative Example 2

A printed-wiring board and a flexible printed circuit board were connected to each other with an ACF, with electronic components detached from the rear surface of the printed-wiring board, using a receiving plate made of ceramic.

Evaluation

Resistance values between the printed-wiring boards and the flexible printed circuit boards connected with the ACF was measured using the four-terminal method. The resistance values measured were average continuity resistance values and maximum continuity resistance values. The results thereof are shown in Table 1.

TABLE 1

| | Ex. 1 | Ex. 2 | Ex. 3 | Comp. Ex. 1 | Comp. Ex. 2 |
|---|---|---|---|---|---|
| Receiving Plate Material | Silicon Rubber (Rubber Hardness Degree: 40) | Silicon Rubber (Rubber Hardness Degree: 90) | Silicon Rubber (Rubber Hardness Degree: 20) | Ceramic | Ceramic |
| Average Continuity Resistance ($\Omega$) | 0.02 | 0.02 | 0.1 | No Connection | 0.02 |
| Maximum Continuity Resistance ($\Omega$) | 0.03 | 0.03 | 1.6 | No Connection | 0.03 |

In Examples 1 and 2, the same degrees of continuity resistance as in Comparative Example 2 can be realized. To the contrary, in Comparative Example 1 using the receiving plate made of ceramic in connecting with the ACF the printed circuit board having the electronic components mounted on the rear surface thereof, even connection cannot be obtained satisfactorily. In addition, in Example 3 in which the rubber hardness degree of the receiving plate made of silicon rubber is 20, though connection with the ACF can be attained, the degrees of continuity resistance are high. It can be understood from these results that use of the receiving plate made of silicon rubber and provided with the concave portions corresponding in position to the electronic components is effective in connecting the flexible printed circuit board to the printed circuit board having the electronic components mounted thereon with the ACF and that by setting the rubber hardness degree of the receiving plate made of silicon rubber to be in the range of 40 to 90, good connection with the ACF exhibiting a small connection resistance value can be realized.

The invention claimed is:

1. A wiring board receiving plate used in connecting a connecting member to a first wiring board having an electronic component mounted thereon through a thermal compression bonding,
    wherein the wiring board receiving plate is made of an elastic material and has a concave portion corresponding in a shape to the electronic component of the first wiring board so as to provide a mounting position of the electronic component of the first wiring board, and
    wherein the concave portion has a depth set to be larger than a mounting height of the electronic component and, when a flat portion of a rear surface of the first wiring board abuts on an upper surface of the wiring receiving plate, a top portion of the electronic component housed in the concave portion and a bottom surface of the concave portion form therebetween a space of 1 mm or less.

2. A wiring board receiving plate according to claim 1, wherein the connecting member connected through the thermal compression bonding is a second wiring board or electronic component.

3. A wiring board receiving plate according to claims 1, wherein the elastic material is a silicone rubber.

4. A wiring board receiving plate according to claim 1, wherein the elastic material has a rubber hardness degree of 40 to 90 prescribed by the Japanese Industrial Standards S 6050.

5. A device for connection of a wiring board, comprising a bottom plate for supporting thereon a first wiring board having an electronic component mounted thereon; a thermal compression bonding head disposed on the first wiring board via an adhesive agent for applying pressure to a connecting member and heating the adhesive agent to subject the connecting member to thermal compression bonding; and a wiring receiving plate for supporting on the bottom plate a mounting surface of the electronic component of the first wiring board;
    wherein the wiring receiving plate is made of an elastic material and has a concave portion corresponding in a shape to the electronic component of the first wiring board so as to provide a mounting position of the electronic component of the first wiring board, and
    wherein the concave portion has a depth set to be larger than a mounting height of the electronic component and, when a flat portion of a rear surface of the first wiring board abuts on an upper surface of the wiring receiving plate, a top portion of the electronic component housed in the concave portion and a bottom surface of the concave portion form therebetween a space of 1 mm or less.

6. A device for connection of a wiring board according to claim 5, wherein the connecting member connected through the thermal compression bonding is a second wiring board or electronic component.

7. A device for connection of a wiring board according to claim 5, wherein the elastic material is a silicone rubber.

8. A device for connection of a wiring board according to claim 5, wherein the elastic material has a rubber hardness degree of 40 to 90 prescribed by the Japanese Industrial Standards S 6050.

9. A method for connection of a wiring board, comprising
    supporting a lower surface of a first wiring board having an electronic component mounted thereon on a wiring receiving plate made of an elastic material and provided at a mounting position of the electronic component of the first wiring board with a concave portion corresponding in shape to the electronic component;
    using a thermal compression bonding head to apply pressure to a connecting member and heat an adhesive agent; and
    subjecting the connecting member to thermal compression bonding relative to the first wiring board;
    wherein the wiring receiving plate has an upper surface abutting on a flat surface of the first wiring board at a time of the thermal compression bonding and the concave portion has a bottom surface when applying the pressure to contact with a top of the electronic component mounted on the first wiring board.

10. A method for connection of a wiring board according to claim 9, wherein the connecting member connected through the thermal compression bonding is a second wiring board or electronic component.

* * * * *